United States Patent [19]

Misu et al.

[11] Patent Number: 4,954,793

[45] Date of Patent: Sep. 4, 1990

[54] FILTER BANK

[75] Inventors: Koichiro Misu; Shusou Wadaka; Tsutomu Nagatsuka, all of Kanagawa, Japan

[73] Assignee: Mitsubishi Denki Kabushiki Kaisha, Tokyo, Japan

[21] Appl. No.: 214,521

[22] Filed: Jul. 1, 1988

[30] Foreign Application Priority Data

Dec. 25, 1987 [JP] Japan .................................. 327240

[51] Int. Cl.⁵ .......................... H03H 7/46; H03H 9/76
[52] U.S. Cl. ..................................... 333/133; 333/193;
310/313 R
[58] Field of Search ............... 333/150, 151, 153, 154, 333/193-196, 133; 310/313 R, 313 B, 313 C, 313 D

[56] References Cited

U.S. PATENT DOCUMENTS 4,295,108 10/1981 Ieki ....................................... 333/193
4,689,586 8/1987 Yamada et al. ................... 333/154 X

FOREIGN PATENT DOCUMENTS 194615 11/1982 Japan ................................. 333/195
81910 5/1985 Japan ................................. 333/195
81911 5/1985 Japan ................................. 333/194

OTHER PUBLICATIONS

Denis C. Webb et al., "A Saw Contiguous Filter Bank Derived From a Constant-K Ladder", 1975 Ultrasonics Symposium Proceedings, IEEE Cat. #75, CHO 994-4SU, pp. 311-314.
Denis C. Webb et al., "Properties of a Constant-k Ladder SAW Contiguous Filter Bank", IEEE Transactions on Sonics and Ultrasonics, vol. SU-23, No. 6, Nov. 1976, pp. 386-393.

Primary Examiner—Eugene R. Laroche
Assistant Examiner—Benny T. Lee
Attorney, Agent, or Firm—Bernard, Rothwell & Brown

[57] ABSTRACT

A filter bank constituted in such a manner that an interdigital transducer on the input side of a plurality of each of surface acoustic wave filters having different pass bands is used as a shunt element and the shunt element is connected to a series element composed of reactance elements to form a ladder-type circuit, and a circuit composed of an inductor and a capacitor connected in parallel with each other is used as one part of the series element to form a pole near the cut-off frequency, to increase an amount of attenuation of a T-type circuit near the cut-off frequency, and to largely reduce transmitted electric power of spurious components even in a surface acoustic wave filter in a section near a signal source.

4 Claims, 6 Drawing Sheets (a)

(b)

FILTER BANK

BACKGROUND OF THE INVENTION

1. Field of the Invention

The present invention relates to a filter bank composed of a plurality of surface acoustic wave filters having different pass bands.

2. Description of the Prior Art

FIG. 1 is a circuit diagram showing a conventional filter bank illustrated in 1975 Ultrasonics Symposium Proceedings, IEEE Cat. #75 CHO 994-4SU pp. 311-314. In the diagram, the numeral 1 shows a plurality of surface acoustic wave filters having different pass bands, which are provided on a surface of a piezo-electric substrate to perform conversion between electric signals and surface acoustic waves. These filters are connected using an interdigital transducer 2-a as a shunt element and an inductor 3 as a series element on each input side in the form of ladders with each other. An output terminal of an interdigital transducer 2-b on the output side of each surface acoustic wave filter 1 forms each output terminal 4 of a filter bank, to which each load resistor 5 is connected. The numerals 6, 7, and 8 show a source resistance, a signal source, and a termination resistance, respectively.

Next, the operation will be described.

The filter bank shown in FIG. 1 has a construction which each T-type circuit comprising a series element, that is, two series inductors 3 and a shunt element, that is, an interdigital transducer 2-a is cascade connected. Here, in order to make the operation of the filter bank simple, these will be given a description of characteristics of one section of the T-type circuit shown in FIG. 2. At the frequency for which the surface acoustic wave filter 1 forms a pass band, the interdigital transducer 2-a on the input side is represented by an equivalent circuit shown in FIG. 4(a). Here, a capacitor 9 corresponds to a static capacitance of the interdigital transducer 2-a on the input side. A resistor 10 is a radiation resistance. The electric power dissipated in this resistor 10 corresponds to an electric power transformed to a surface acoustic wave. Since the surface acoustic wave is not excited except in the pass band, the interdigital transducer 2-a is represented outside the pass band by an equivalent circuit comprising only a capacitor 9 as shown in FIG. 4(b). Accordingly, the T-type circuit shows a low pass type characteristic at the frequencies other than the above-mentioned frequency. FIG. 3 shows a low pass type characteristic, that is, a power $P_E$ fed to a terminal resistor 8. A cut-off frequency fc, that is, the frequency at which a power $P_E$ drops to the level of 3dB is decided by inductance of the inductor 3 and capacitance of the interdigital transducer 2-a on the input side.

Since, at a frequency lower than the cut-off frequency fc, the T-type circuit is represented by an equivalent circuit shown in FIG. 4(b) outside the pass band of the surface acoustic wave filter 1, an electric power input to the T-type circuit is completely outputted to the terminal resistor 8. In other words, the T-type circuit operates as a simple transmission line. On the other hand, since the T-type circuit is represented by an equivalent circuit FIG. 4(a) at the pass band of the surface acoustic wave filter 1, the level of the electric power $P_E$ decreases slightly. Corresponding to this, FIG. 3 shows electric powers $P_1$, $P_2$, and $P_3$ fed to the load resistor 5. Here, $P_1$ is the transmitted electric power at the fundamental frequency fo of the surface acoustic wave filter 1 and $P_2$ is the transmitted electric power due to undesired spurious response caused by bulk waves of the surface acoustic wave filter 1. Power $P_2$ contains frequency components between fc and a second harmonic 2fo. $P_3$ is a transmitted electric power due to the third harmonic 3fo.

Next, the case where the above-mentioned T-type circuit of one section is cascade connected in multi-stages to constitute a filter bank as shown will be described. Since each T-type circuit operates as a simple transmission line at frequencies lower than the cut-off frequency fc of the T-type circuit and outside the pass band of the surface acoustic wave filter 1, even if a plurality of T-type circuits composed of surface acoustic wave filters 1 each having a different pass band are cascade connected in multi-stages, the output level at the load resistor 5 at the pass band of each surface acoustic wave filter 1 is nearly equal to that in the case where only one section of the T-type circuit is used.

Now, the filter bank need output only an electric power $P_1$ at the fundamental frequency of each surface acoustic wave filter 1 and the output levels of other frequency components should be sufficiently low. Accordingly, electric powers $P_2$ and $P_3$ are unnecessary spurious components.

Until now, even the filter bank of this kind can only slightly decrease levels of the electric powers $P_2$ and $P_3$ using low pass characteristics of the T-type circuit. In other words, by placing the stop band of the T-type circuit on the frequency range of the electric powers $P_2$ and $P_3$, the electric powers $P_2$ and $P_3$ due to unnecessary spurious responses at the output terminal 4 of the filter bank can be slightly reduced in level compared with the case where a single surface acoustic wave filter not constituting a filter bank is employed.

Since a conventional filter bank is constituted as described above, an amount of attenuation of a transmitted electric power at the stop band per one section of the T-type circuit is reduced. There was, therefore, a problem that it is more difficult for the surface acoustic wave filter 1 having a section closer to the signal source 7 to obtain attenuation effect due to the T-type circuit, and it is nearly impossible to reduce the electric power $P_2$ and $P_3$ containing spurious components.

SUMMARY OF THE INVENTION

The present invention is devised in order to solve such a problem as above-mentioned, and its object is to obtain a filter bank capable of reducing a transmitted electric power containing spurious components to a minimum for a surface acoustic wave filter in all sections including a surface acoustic wave filter in a section close to a signal source.

The filter bank according to the present invention is constituted in such a manner that interdigital transducers on the input side of a plurality of surface acoustic wave filters having different pass bands are used as shunt elements, the shunt elements are connected to series elements comprising reactance elements to constitute a ladder circuit, a circuit composed of an inductor and a capacitor connected in parallel with each other is used as one part of the series elements, and an inductor is used as the series element in other parts.

Accordingly, the filter bank in the present invention can form a pole near the cut-off frequency by using a circuit composed of an inductor and a capacitor connected in parallel with each other as one part of the series elements. By this, the filter bank operates so as to cause an amount of attenuation in the T-type circuit near the cut-off frequency to be increased, and transmitted electric power of spurious components to be largely reduced.

DETAILED DESCRIPTION OF THE PREFERRED EMBODIMENT

Figure 5:
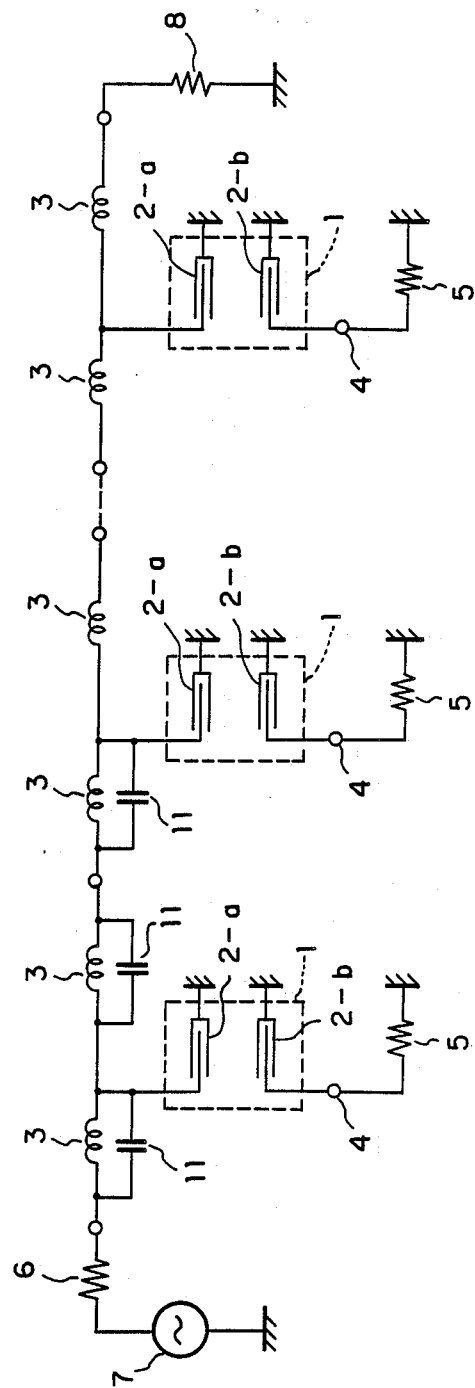
FIG. 5 is a circuit diagram showing a filter bank of an embodiment according to the present invention.

Hereinafter, an embodiment according to the present invention will be described with reference to drawings. In FIG. 5, the numeral 1 shows a surface acoustic wave filter and it constitutes a T-type circuit using an interdigital transducer 2-a on the input side as a shunt element and a single inductor 3 or a circuit composed of an inductor 3 and a capacitor 11 connected in parallel with each other as a series element. These T-type circuits are cascade connected in multiple stages to form a filter bank. The output side of the interdigital transducer 2-b on the output side of a plurality of the surface acoustic wave filters 1 having different pass-bands forms an output terminal 4 of each section of the filter bank, and a load resistor 5 is connected to the terminal 4. A circuit having a construction in which the T-type circuits are cascade connected in multiple stages is terminated by a terminal resistor 8. The numerals 6 and 7 are a source resistance and a signal source respectively.

Next, the operation of this embodiment will be described.

The characteristics of the T-type circuit composed of only the inductor 3 are same as those of the above-mentioned conventional filter bank.

Figure 1:
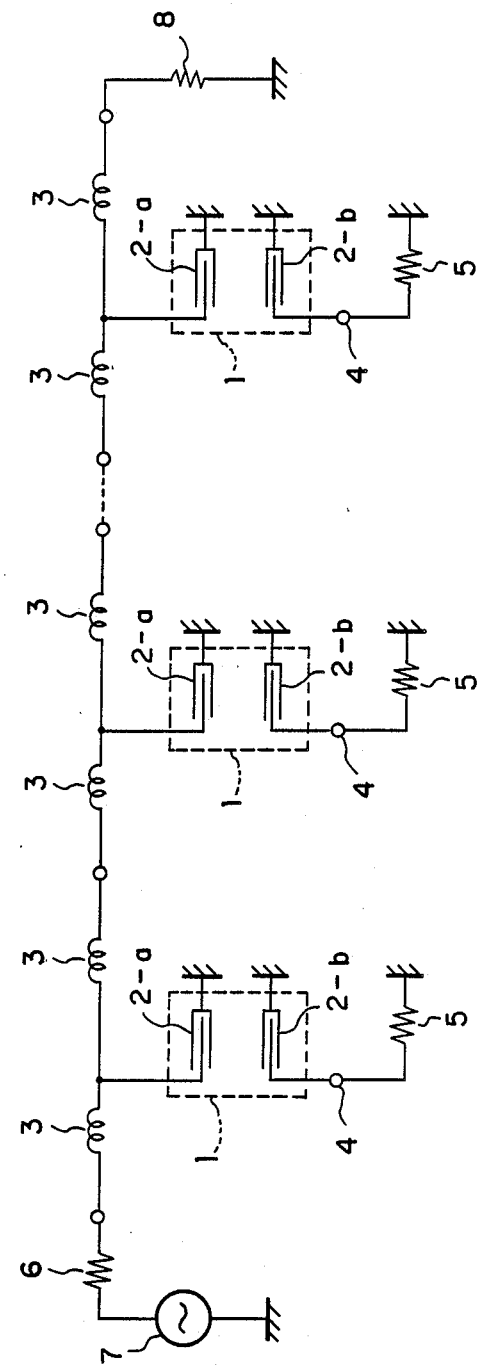
FIG. 1 is a diagram showing a conventional filter bank of this kind.
Figure 2:
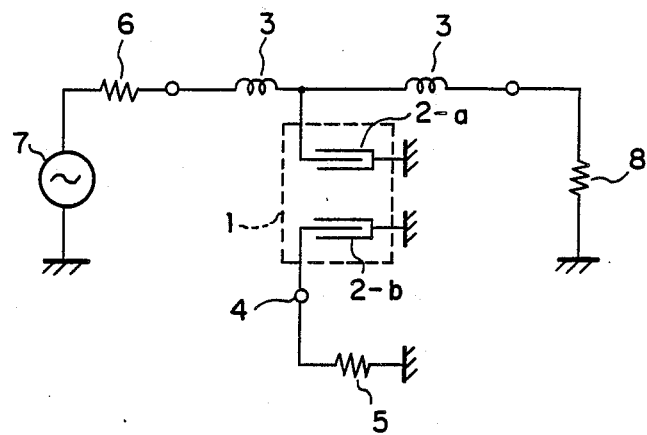
FIG. 2 is a circuit diagram showing one section of a conventional T-type circuit using only inductors as series elements.
Figure 3:
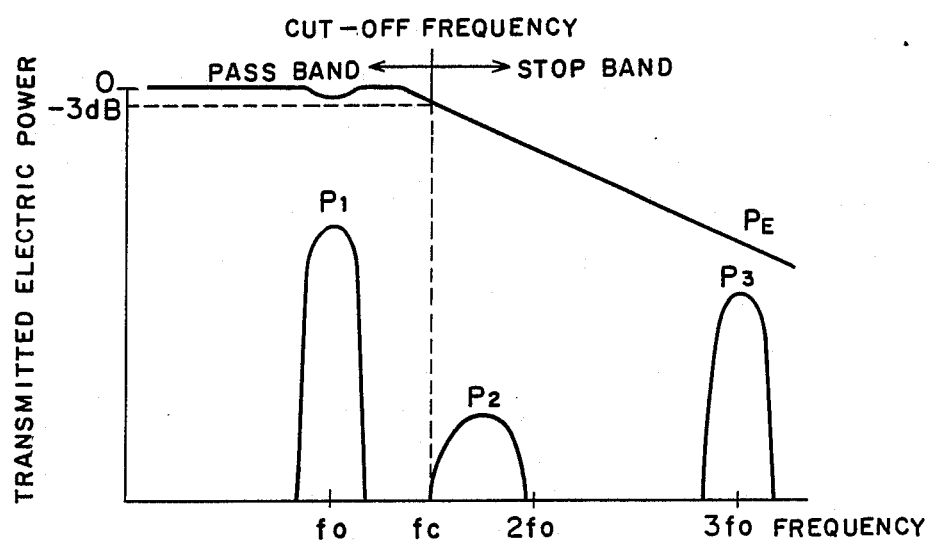
FIG. 3 is a characteristic diagram showing band characteristics of the transmitted electric power in the circuit shown in FIG. 2.
Figure 4:
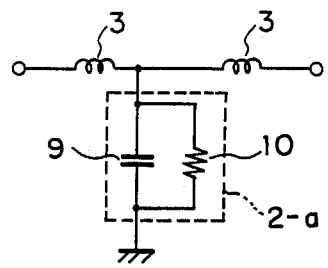
FIG. 4 is a diagram showing an equivalent circuit of a surface acoustic wave filter of a conventional T-type circuit using only inductors as series elements at its pass band and an equivalent circuit of the filter at frequencies outside the pass band of the above-mentioned T-type circuit.
Figure 4:
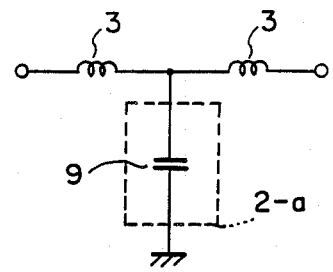
Figure 6:
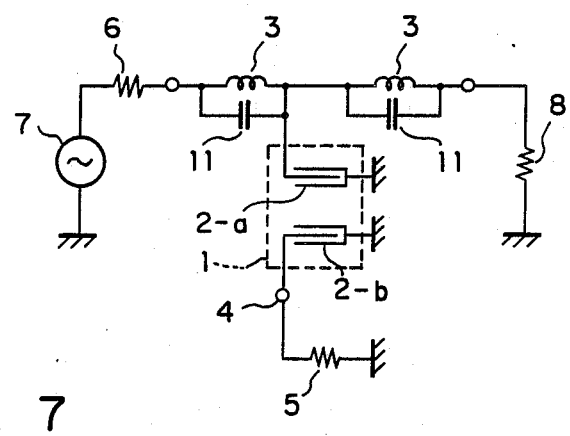
FIG. 6 is a circuit diagram showing one section of a T-type circuit composed of an inductor and a capacitor connected in parallel with each other as a series element.
Figure 7:
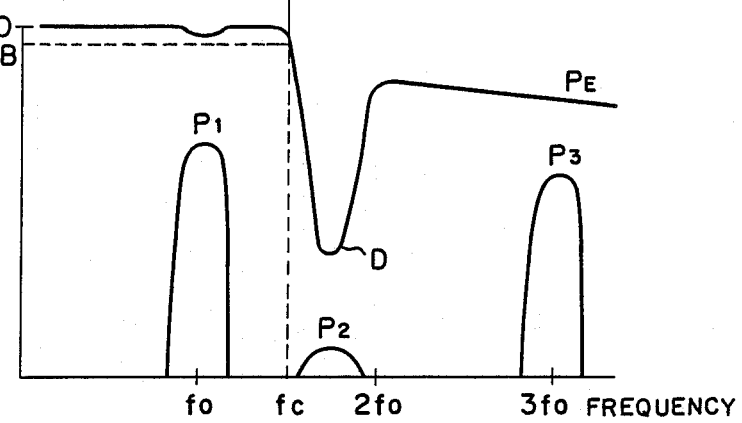
FIG. 7 is a characteristic diagram showing a band characteristic of a transmitted electric power in the circuit shown in FIG. 2.

The constitution and the characteristics of one section of the T-type circuit consisting of the circuit according to the present invention, in which the series element is composed of the inductor 3 and the capacitor 11 connected in parallel with each other are shown in FIG. 6 and FIG. 7. In other words, FIG. 6 shows the constitution of the T-type circuit, and FIG. 7 shows band characteristics of the electric power $P_E$ fed to the terminal resistor 8 and the electric powers $P_1$, $P_2$, and $P_3$ fed to the load resistor 5. Frequencies fc, fo, 2fo and 3fo denote the same frequencies as described for FIG. 3. Here, $P_1$ is a transmitted electric power at the fundamental frequency of the surface acoustic wave filter 1, $P_2$ is a transmitted electric power due to the bulk waves, and $P_3$ is a transmitted electric power at the third harmonic. Among them, the electric powers $P_2$ and $P_3$ are unnecessary spurious components. A characteristic of the T-type circuit has a feature that a pole D is generated near the cut-off frequency fc. This pole is generated by resonance of the series elements, that is the inductor 3 and the capacitor 11 with the shunt element, that is, the input impedance of the interdigital transducer 2-a. Utilizing this, for instance, as shown in FIG. 7, if the pole is made in the frequency range in which spurious components $P_2$ are present, the spurious components can be largely reduced. Since the impedance of the inductor 3 is smaller than that of the capacitor 11 at frequencies lower than that in which the pole D is produced, the characteristic of the impedance of the series element is mainly decided by the inductor 3. This T-type circuit is, therefore, provided with substantially the same characteristic as the conventional one using only the inductance 3 as the series element at a frequency lower than that at which the pole D is produced. At the frequency lower than the cut-off frequency fc, this T-type circuit therfore exhibits the same frequency response as the conventional one.

On the other hand, in the frequency range higher than that in which the pole is produced the impedance characteristic of the series element is mainly decided by the capacitor 11, because the impedance of the capacitor 11 becomes small. The above-mentioned T-type circuit does not, therefore, exhibit such an attenuation characteristic as the conventional one, and at the frequencies higher than that at which the pole is produced, an amount of attenuation is increased relative to the case where only the inductor 3 is used as the series element. In the case where only the circuit composed of the inductor 3 and the capacitor 11 connected in parallel with each other is used, it is possible to obtain a great amount of attenuation in a specific frequency range, but it is difficult to obtain a great amount of attenuation in a wide frequency range.

In order to avoid this phenomenon, the filter bank according to a present invention has the section in which the circuit composed of the inductor 3 and the capacitor 11 connected in parallel with each other as the series element is used and a section in which only the inductor 3 is used, thereby allowing a great amount of attenuation to be obtained ranging from the neighborhood of the cut-off frequency fc to a wide frequency range on the higher frequency side. Especially, the use of the circuit composed of the inductor 3 and the capacitor 11 connected in parallel with each other as the series element in the section near the signal source 7 permits electric powers $P_2$ and $P_3$ of spurious components in the surface acoustic wave filter 1 in the section near the signal source 7 to be largely reduced by the effect of the pole D, which was difficult to realize in the conventional filter bank of this kind.

The T-type circuit using the circuit comprised of the inductor 3 and the capacitor 11 connected in parallel with each other as the series element is slightly different in its frequencY responses from the T-type circuit using only the inductor 3. Only cascade connection of these T-type circuits produces multipath reflection in the inside of the filter bank, not permitting desired characteristics to be realized.

In order to avoid this phenomenon, in the filter bank according to the present invention, as in the second T-type circuit, that is, the one next to the signal source 7 in FIG. 5, circuit composed of the inductor 3 and the capacitor 11 connected in parallel with each other is used as one component of the series element, and a circuit composed of only the inductor 3 is used as the other components of the series element. In other words, by utilizing this impedance matching effect of the T-type circuit having different series elements, the influence of the multipath reflection in the inside of the above-mentioned filter bank is removed to obtain required characteristics.

Figure 8:
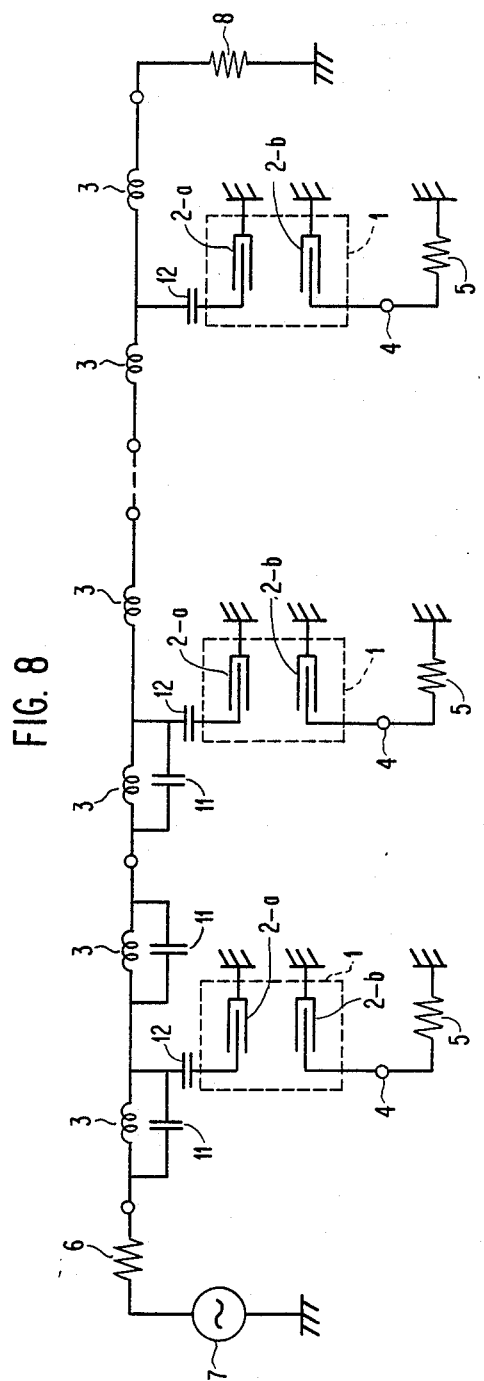
FIGS. 8 and 9 are circuit diagrams illustrating alternate embodiments of FIG. 5.
Figure 9:
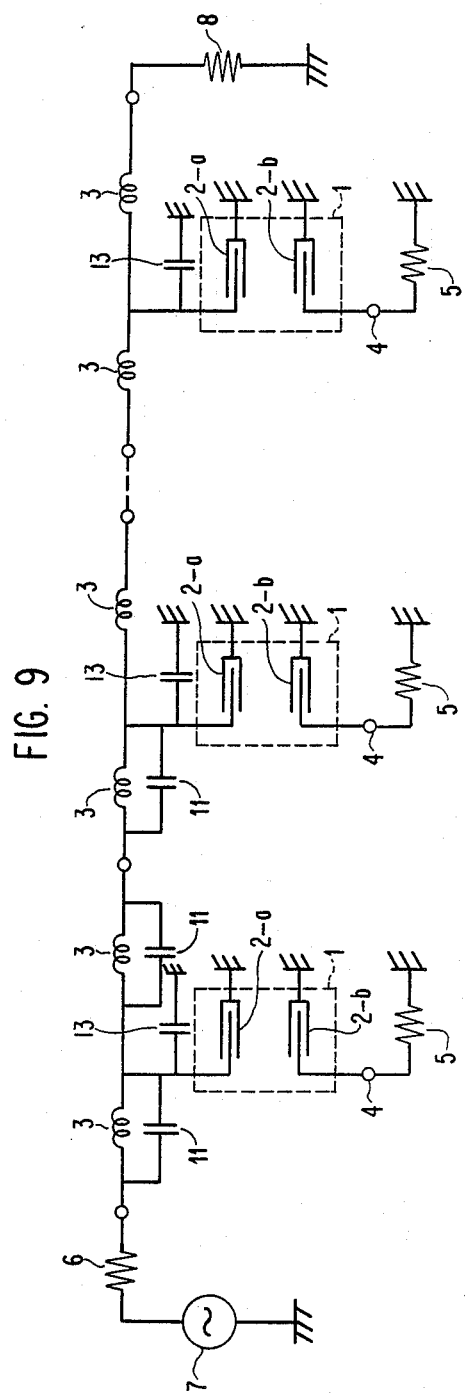

Though there was shown the case where only the interdigital transducer 2-a on the input side was used as the shunt element in the above-mentioned embodiment, not only the interdigital transducer 2-a on the input side but also a circuit composed of the interdigital transducer 2-a and a capacitor connected thereto in parallel, such as capacitor 13 of FIG. 9, or in series, such as capacitor f12 of FIG. 8 may be used as the shunt element.

Furthermore, though in each T-type circuit, a shunt element composed of one interdigital transducer 2-a on the input side was used, a plurality of the interdigital transducers 2-a connected in parallel or in series with each other or connected in series and in parallel with each other may be used as the shunt element of one T-type circuit.

A T-type circuit composed of the inductor 3 and the capacitor 11 connected in parallel with each other may be disposed in an arbitrary section of the filter bank as the series element. In this case, frequencies at which the pole D is produced need not be all the same.

Though, in the above-mentioned embodiment, there has been described the case where a circuit composed of the inductor 3 and the capacitor 11 connected in parallel with each other has been used as one part of the series element, even in the case where a circuit composed of the inductor 3 and the interdigital transducer 2-a connected in series with each other are used as one part of the shunt element, the same characteristics as those of the above-mentioned embodiment can be realized.

As described previously, the filter bank according to the present invention is constituted in such a manner that the circuit composed of the inductor and the capacitor connected parallel with each other is used as one part of the series element which constitutes the T-type circuit with the shunt element and only the inductor is used as the other part of the series. There is, therefore, an effect that a filter bank capable of largely reducing transmitted electric power of unnecessary spurious components in outputs of each surface acoustic wave filter can be obtained.

What is claimed is:
1. A filter bank, comprising:
   a plurality of T-type circuits connected in cascade between a signal source and a terminal impedance, each T-type circuit including,
   a surface acoustic wave (SAW) filter having a frequency pass band for passing power signals therethrough, and
   a plurality of reactance elements connected in series forming a series element,
   said SAW filter having an input side connected between two predetermined reactance elements of said series element and having an output side connected to an output terminal;
   each SAW filter in said plurality of T-type circuits having a pass band of a different frequency for passing power signals from said signal source therethrough;
   each T-type circuit having its series element connected to series elements of adjacent T-type circuits to form said plurality of T-type circuits connected in cascade between said signal source and said terminal impedance;
   reactance elements of selected ones of said T-type circuits consisting of inductance elements and reactance elements of other T-type circuits consisting of a parallel connection of an inductance element and a capacitance element, to reduce transmission of spurious power signals through said SAW filters.

2. A filter bank composed of a plurality of surface acoustic wave (SAW) filters, each filter having input side and output side interdigital transducer means for converting between electric signals and surface acoustic waves, each SAW filter further comprising:
   a series element formed by a plurality of reactance elements in series connection with each other, an input side interdigital transducer means of said SAW filter connected to a connection point of said series element and an output side interdigital transducer means of said SAW filter connected to an output terminal to form a parallel element;
   said series element and parallel element forming a T-type circuit as a constituent unit of said filter bank, said filter bank comprising a plurality of said T-type circuits being interconnected via said series elements, respective frequency bands of input power signals transmitted through respective surface acoustic wave filters of each T-type circuit being different from each other;
   selected ones of said reactance elements of said plurality of T-type circuits consisting of a parallel connection of an inductance element and a capacitance element and other ones of said reactance elements consisting of an inductance element, to generate a damping pole near cut-off frequencies of each surface acoustic wave filter.

3. A filter bank according to claim 2, wherein at least one said input side interdigital transducer means includes a capacitor connected in series thereto.

4. A filter bank according to claim 2, wherein at least one said input side interdigital transducer means includes a capacitor connected in parallel thereto.

* * * * *

UNITED STATES PATENT AND TRADEMARK OFFICE
CERTIFICATE OF CORRECTION

PATENT NO. : 4,954,793
DATED : September 4, 1990
INVENTOR(S) : KOICHIRO MISU ET AL.

It is certified that error appears in the above-identified patent and that said Letters Patent is hereby corrected as shown below:

Title Page, Col. 2, [57], line 4, after "of" (first occurrence) insert --each of--; same line, delete "each"; line 5, delete "of".

Col. 1, line 7, ",surface" should be --surface--;
line 29, before "which" insert --in--.

line 64, "frequencY" should be --frequency--.

Col. 5, line 2, delete "as";
line 3, after "the" (second occurrence) insert --one of the closest to the--.
line 4, before "circuit" insert --a--;
line 8, "components" should be --component--;
line 21, "f12" should be --12--;
line 34, "be all" should be --all be--;
line 50, after "series" insert --element--.

Signed and Sealed this

Twenty-first Day of April, 1992

*Attest:*

HARRY F. MANBECK, JR.

*Attesting Officer*    *Commissioner of Patents and Trademarks*